US011203273B2

(12) United States Patent
Otjens

(10) Patent No.: US 11,203,273 B2
(45) Date of Patent: Dec. 21, 2021

(54) METHOD AND APPARATUS FOR INDICATING A STATE OF HEALTH OF A BATTERY

(71) Applicant: ANWB B.V., Gravenhage (NL)

(72) Inventor: Jimmy Otjens, Leiden (NL)

(73) Assignee: ANWB B.V., 'S-Gravenhage (NL)

( * ) Notice: Subject to any disclaimer, the term of this patent is extended or adjusted under 35 U.S.C. 154(b) by 0 days.

(21) Appl. No.: 16/759,850

(22) PCT Filed: Oct. 30, 2018

(86) PCT No.: PCT/NL2018/050722
§ 371 (c)(1),
(2) Date: Apr. 28, 2020

(87) PCT Pub. No.: WO2019/088830
PCT Pub. Date: May 9, 2019

(65) Prior Publication Data
US 2020/0331359 A1    Oct. 22, 2020

(30) Foreign Application Priority Data
Oct. 30, 2017    (NL) ..................... 2019831

(51) Int. Cl.
*B60L 58/16*    (2019.01)
*G01R 31/392*    (2019.01)
(Continued)

(52) U.S. Cl.
CPC ............ *B60L 58/16* (2019.02); *B60L 58/12* (2019.02); *G01R 31/392* (2019.01);
(Continued)

(58) Field of Classification Search
CPC .... B60L 58/16; B60L 58/12; B60L 2240/545; B60L 2240/662; B60L 58/10;
(Continued)

(56) References Cited

U.S. PATENT DOCUMENTS 6,118,252 A    9/2000  Richter
6,369,578 B1 *  4/2002  Crouch, Jr. ........... H02J 7/0047
                                                324/426
(Continued)

FOREIGN PATENT DOCUMENTS

CN    108120933 A  *  6/2018  ........... G01R 31/367
DE   112009001552    *  5/2011
(Continued)

OTHER PUBLICATIONS

Ross Kerley, Automotive Lead-Acid Battery State-of-Health Monitoring System, Jul. 30, 2014, 60 pages (Year: 2014).*

*Primary Examiner* — Tung S Lau
(74) *Attorney, Agent, or Firm* — Volpe Koenig

(57) ABSTRACT

A method and apparatus for determining a state of health of a battery in a vehicle includes determining a state of charge of the battery; determining a battery temperature and a cranking temperature; obtaining a cranking signal from the battery when the battery is discharged during cranking of a combustion engine of the vehicle; determining one or more cranking type classes based on the determined battery temperature and the determined cranking temperature; determining battery parameters from the cranking signal; determining the state of health of the battery from the battery parameters, a vehicle identifier and historical battery parameters determined in a historic state preceding the current state; and outputting the state of health. Determining the battery parameters from the cranking signal includes: obtaining an intermediate cranking signal based on the cranking signal and a window function; and determining the battery parameters from the filtered cranking signal.

16 Claims, 8 Drawing Sheets

(51) Int. Cl.
*B60L 58/12* (2019.01)
*G01R 31/3835* (2019.01)
*G01R 31/36* (2020.01)

(52) U.S. Cl.
CPC ..... *B60L 2240/545* (2013.01); *G01R 31/3647* (2019.01); *G01R 31/3835* (2019.01)

(58) Field of Classification Search
CPC .............. G01R 31/392; G01R 31/3835; G01R 31/3647; G01R 31/386; Y02T 10/70; Y02T 90/16
See application file for complete search history.

(56) References Cited

U.S. PATENT DOCUMENTS

| | | | | |
|---|---|---|---|---|
| 6,469,512 B2* | 10/2002 | Singh | ................ | G01R 31/389 |
| | | | | 324/426 |
| 6,472,875 B1 | 10/2002 | Meyer | | |
| 6,727,708 B1 | 4/2004 | Dougherty et al. | | |
| 7,743,649 B1* | 6/2010 | Salman | ............... | F02N 11/0862 |
| | | | | 73/114.59 |
| 8,111,037 B2* | 2/2012 | Zhang | ................ | H01M 10/486 |
| | | | | 320/104 |
| 8,972,213 B2* | 3/2015 | Zhang | ................ | G01R 31/392 |
| | | | | 702/63 |
| 9,816,475 B1* | 11/2017 | Buchanan | ........... | F02N 11/0866 |
| 2007/0090844 A1* | 4/2007 | Klang | ................ | G01R 31/3648 |
| | | | | 324/426 |
| 2008/0150457 A1* | 6/2008 | Salman | ..................... | B60L 3/12 |
| | | | | 318/139 |
| 2009/0326841 A1* | 12/2009 | Zhang | ................. | G01R 31/392 |
| | | | | 702/63 |
| 2010/0026306 A1* | 2/2010 | Zhang | ................ | G01R 31/3647 |
| | | | | 324/426 |
| 2010/0154524 A1* | 6/2010 | Salman | ............... | F02N 11/0862 |
| | | | | 73/114.59 |
| 2011/0082621 A1* | 4/2011 | Berkobin | ............... | B60L 58/10 |
| | | | | 701/31.4 |
| 2011/0231054 A1* | 9/2011 | Zhang | ................ | H01M 10/482 |
| | | | | 701/31.4 |
| 2013/0046435 A1 | 2/2013 | Shin et al. | | |
| 2014/0049226 A1 | 2/2014 | Mao | | |
| 2015/0361941 A1 | 12/2015 | Du et al. | | |
| 2018/0201151 A1* | 7/2018 | Dudar | ....................... | B60L 1/00 |

FOREIGN PATENT DOCUMENTS

| | | | | |
|---|---|---|---|---|
| GB | 2537612 A | * 10/2016 | ............. | G01R 31/36 |
| JP | 2003-519900 A | * 6/2003 | ............. | G01R 31/36 |
| KR | 2012-0004670 A | * 2/2012 | ............. | B60W 10/24 |
| WO | 2009158224 A2 | 12/2009 | | |
| WO | 2009158225 A2 | 12/2009 | | |
| WO | 2014098837 A1 | 6/2014 | | |

\* cited by examiner

METHOD AND APPARATUS FOR INDICATING A STATE OF HEALTH OF A BATTERY

FIELD OF THE INVENTION

The present invention relates to a method and device for indicating a state of health of a battery in a vehicle. In general, batteries are applied in vehicle for cranking a combustion engine.

BACKGROUND ART

Battery technology comprises a combination of chemistry, material, mechanical and electrical science. An aggregation of these technologies yields to a small electrical-energy producing device, referred to as a battery. In the automotive sector lead acid batteries are used in cranking applications.

The state of health, SOH, of lead acid batteries is decreasing with age revealing a reduced battery performance. The performance of lead acid batteries is expressed in capacity and peak power delivery.

The effective performance and therefore the SOH of the battery is gradually decreasing until a cranking failure manifests itself. Batteries can have different failure modes caused by a combination of underlying failure mechanisms. A battery is a closed system and progressing failure mechanisms cannot be observed without the use of invasive methods i.e. to really reveal the battery's SOH the casing has to be opened enabling the internals to be examined which will destroy the battery. Most failures are caused by a combination of different failure mechanisms. Using a non-invasive SOH estimator groups all progressing failure mechanisms together, but enables the SOH to be estimated without destroying the battery. Conventionally, non-invasive SOH estimators are based on the effective capacity and internal resistance of the battery.

A method and apparatus for indicating a state of health of a battery is known from US20130046435. A starting system for an internal combustion engine includes a starter motor and a battery. A method for evaluating the starting system includes detecting a fault associated with the starter motor when a minimum starting system voltage during a cranking event is greater than a threshold minimum starting system voltage determined in relation to an engine acceleration parameter, and detecting a fault associated with the battery when the engine acceleration parameter is less than a minimum threshold for the engine acceleration parameter.

A drawback of the known device and method is that the indication of the state of the battery is not reliable.

Therefore, there is a need to provide a more efficient method and a device estimating the state of health of the battery.

U.S. Pat. No. 6,118,252A relates to a process for determining the starting capacity of a starter battery of a motor vehicle for which the mean value for the voltage surge during the starting of an internal combustion engine, is determined as a function of mean values for the battery and engine temperatures, compared with the voltage surge values of a characteristic line field which records determined voltage surges as a function of corresponding battery and engine temperatures, a deviation of the actually determined voltage surge from the voltage surge stored in the characteristic line field is determined and compared to a preassigned value, and an indicator or an alarm is triggered as soon as the preassigned value is exceeded.

US 2015/361941 A1 discloses an internal combustion engine that employs a starting system. A method for evaluating the starting system includes determining a cranking resistance ratio between a starter and a battery of the starting system during engine cranking. The cranking resistance ratio is normalized based upon an operating temperature of the starting system, and the starting system is evaluated based upon the normalized cranking resistance ratio.

WO 2009/158224 A2 discloses a method for determining a battery's state-of-health. An initial battery voltage is measured at a first voltage drop during an initiation of an engine cranking phase. A battery voltage is monitored during the remainder of the engine cranking phase. A lowest battery voltage is determined during the remainder of the engine cranking phase. A determination is made if a voltage difference between the lowest battery voltage and the initial battery voltage at the initiation of the engine cranking phase is less than a voltage threshold. A low battery state-of-health is identified in response to the voltage difference being less than the voltage threshold.

WO 2009/158225 A2 discloses a method for determining a state-of-health of a battery in a vehicle-during an engine cranking phase. An engine cranking phase is initiated. Characteristic data is recorded that includes battery voltage data and engine cranking speed data during the engine cranking phase. The characteristic data is provided to a pre-processing unit. The pre-processing unit normalizes the characteristic data for processing within a classifier. The normalized data is input to the classifier for determining the vehicle battery state-of-health. The classifier has a trained state-of-health decision boundary resulting from a plurality of trials in which predetermined characterization data is collected with known classes. The battery state-of-health is classified based on the trained state-of-health decision boundary.

WO 2014/098837 A1 discloses systems and methods for determining the state of health of a generator battery set and its ability to supply generator starter motor with start-up energy by capturing a profile of voltage across terminals of the battery during a supply of electrical energy from the battery to the starter and comparing the captured voltage profile to a reference voltage profile to determine if a difference between the captured voltage profile and reference voltage profile exceeds an acceptable amount.

U.S. Pat. No. 6,472,875 B1 discloses a process for the detection of a defect of an automotive vehicle battery includes analyzing the time dependence of the discharge voltage across the terminals of the battery. This process has the steps of measuring at least two successive values of the discharge voltage of the battery, during the phase of cranking the engine of the automotive vehicle, for at least two consecutive top dead center points, taking a difference of the measured voltage values, and deducing therefrom whether the battery is charged or defective. The process is built into an electronic computer carried on board the automotive vehicle.

U.S. Pat. No. 6,727,708 B1 discloses a battery monitoring system. The system comprises a means for acquiring a value representative of a first period of time during which the battery will deliver a sufficient amount of power. The system also comprises a means for measuring a set of parameters comprising a voltage of the battery and a temperature of the battery during a second period of time. The system also comprises a means for predicting whether the battery will deliver the sufficient amount of power during a third period of time less than the first period of time. An output signal is provided if the means for predicting determines that the battery will deliver the sufficient amount of power during the third period of time. A system for determining whether a battery for a vehicle will deliver a sufficient amount of power for a sufficient amount of time is also disclosed.

SUMMARY OF THE INVENTION

According to a first aspect, the invention provides a method for determining a state of health of a battery in a vehicle comprising the steps of
a) determining a state of charge of the battery;
b) determining a battery temperature;
c) determining a cranking temperature based on the engine coolant temperature, the ambient temperature, the device temperature and the time elapsed since the last trip;
d) obtaining a cranking signal comprising a plurality of samples from the battery when the battery is discharged during cranking of a combustion engine of the vehicle;
e) determining one or more a cranking type classes based on the determined battery temperature and the determined cranking temperature;
f) determining battery parameters from the cranking signal corresponding to the determined one or more cranking classes;
g) determining the state of health of the battery for at least one or more cranking type classes from the battery parameters corresponding to the cranking type class in a current state, a vehicle identifier and historical battery parameters corresponding to the one or more cranking type classes determined in a historic state preceding the current state; and outputting the state of health;
wherein determining the battery parameters from the cranking signal comprises obtaining an intermediate cranking signal based on the cranking signal and a window function, filtering the intermediate signal and determining the battery parameters from the filtered cranking signal.

According to the present invention, a method for determining a state of health as defined above is provided, in which the method non-invasive measuring of the cranking signal can be applied. For example, a standardized connection implemented in all European vehicles since 2002 can provide a cranking signal of the battery of the vehicle at a number of instants and during cranking. The cranking signal can be a digital signal obtained via the standardised connection. For example from the on board diagnostic device, OBD.

The state of charge of the battery can be used to decide whether to continue or to discontinue the present method depending on the obtained state of charge, because it does not make sense to determine the state of health for a discharged or partly discharged battery. The battery temperature can be based on the temperatures provided by an engine management system via the standardized connection directly after a cranking event. For example, an engine coolant temperature, ambient temperature, device temperature; duration of last operation of the combustion engine and time elapsed since the last operation.

The cranking temperature can be based on the engine coolant temperature, the ambient temperature, the device temperature and the time elapsed since the last trip.

The inventors have acknowledged a high correlation between the voltage values of the battery, the temperature of the engine of the vehicle and the battery. Different cranking type classes can be distinguished based on the determined battery temperature and the cranking temperature. By distinguishing different cranking type classes the estimation of the battery state can be further improved. The battery parameters determined from the cranking signal corresponding to the cranking type class and a vehicle identifier has proven to be reliable state parameters of the battery and enables a reliable determination of the state of health of the battery. According to the invention an intermediate cranking signal is obtained by window function on the cranking signal. The window function can be based on a minimum value, a maximum value and a determined unique end point of the cranking signal. The unique endpoint can be obtained based on a local maximum value of the cranking signal. The inventors has realized that the application of this window function provides a consistent intermediate cranking signal this is independent from a user of the car, so that more accurate state parameters of the battery can be obtained. The determined state of health can be displayed or a warning signal can be generated.

According to an embodiment the historical state of the battery is an initial state of the battery. The initial state can be the state of a new or fresh battery when directly installed in the vehicle.

According to an embodiment the step of determining the state of health comprises performing a normalized field method on the battery parameters in the initial state and the current state for the determined cranking type class for a certain vehicle identified by the vehicle identifier. The normalized field method is used to determine an area based on a combination of the battery parameters indicating a healthy state of the battery or an area indicating a poor state of the battery. The inventors has realized that this method takes advantage of the interdependency between the battery parameters.

According to a still further embodiment determining the battery parameters for the cranking type class in the initial state comprises:
measuring battery parameters measured after each of a plurality of consecutive crank periods;
determining the battery parameters based on an average of the measured battery parameters. By repeating, in the initial state, these steps the battery parameters corresponding to a set of cranking type classes in the initial state can be obtained.

In the normalized field method a normalized value can be obtained by using the quotient of the battery parameters in the current state and the battery parameter in the reference state and by selecting two battery parameters from the set of battery parameters and defining a line in the parameter field defined by the selected battery parameters. The battery parameters can be an initial voltage, IV, a lowest voltage value, LVV, and a mean cranking voltage, MCV. These parameters have proven to be the most promising for estimating the state of health of the battery.

According a still different embodiment the step of determining the state of health comprises
determining a moving window average of the historical battery parameter of a plurality of historic states in the cranking type class;
determining a scaled battery parameter based on the battery parameter determined at the current state and the determined moving window average of the historical battery parameter in the cranking type class;
determining the state of health at the current state from the scaled battery parameters.
This method provides a simple method for determining the state of health of the battery. The moving average can be determined over a certain period, for example 20 historic states of the battery state before a predetermined period, for example 10 historic states, from the current state in a cranking type class. The battery parameters can be the lowest voltage value and the mean cranking voltage.

According to a further embodiment determining the state of charge of the battery comprises determining, after a resting period of the combustion engine, a resting voltage of the battery;

determining a reference value for the resting voltage;

measuring the resting voltage of the battery in the current state after an operating period of the combustion engine;

determining the state of charge of the battery based on the reference resting voltage value, the measured resting value and the operating period;

deciding to continue or discontinue the determination of the state of health of the battery depending of the state of charge of the battery. In this way a state of charge can be determined after a resting period of the battery after an operation period of the vehicle. This steps prevents performing the further steps of the method when the state of charge of the battery is insufficient, for example when the battery is not recharged completely after a short operation or short trip of the vehicle.

According to a further embodiment the battery temperature is based on an engine coolant temperature, ambient temperature, device temperature; duration of last operation of the combustion engine and time elapsed since the last operation. In this way a more reliable estimation of the battery temperature can be obtained.

According to a different embodiment obtaining the intermediate cranking signal based on the cranking signal and a window function comprises determining a minimum of the cranking signal; determining a maximum of the cranking signal between the first sample of the cranking signal and the determined minimum of the cranking signal; determining an endpoint of the cranking signal that corresponds to a sample number corresponding to a value that is equal to a predetermined coefficient multiplied by the determined maximum and the sample number is larger than the sample number corresponding to the determined minimum; wherein the window function is arranged to pass the samples between the determined maximum and the determined end point of the cranking signal and obtaining the intermediate cranking signal. The coefficient can be determined experimentally. A practical value is 0.9. An advantage of the application of determined end point of the cranking signal and the application of this window function is that a consistent intermediate cranking signal is obtained that is independent from the user of the car.

According to an embodiment the filtering of the intermediate signal comprises splitting the intermediate cranking signal in a first part comprising samples in the range between a maximum and a minimum and a second part comprising samples in the range between the minimum and an endpoint, filtering the first and second parts by a first and second digital filter respectively; and obtaining the filtered cranking signal by concatenating the filtered first and second parts. By splitting the intermediate cranking signal, different digital filters can be applied on the first and second parts the different digital filters can be individually optimized depending on the characteristics of the first and second parts and the filtered cranking signal.

According to a still further embodiment the first and second digital filter respectively, comprises a Saviki-Golay filter, wherein a frame length and a polynomial order of the respective filters can be selected differently depending on the characteristics of respective first and second part. The Saviky-Golay filter is a well-known digital filter for the person skilled in the art. The frame length and polynomial order can be differently selected depending on the variation of the values in the first and second part.

According to a second aspect, the invention provides a device for determining a state of health of a battery in a vehicle comprising storage device, an input device, an output device comprising a display, a communication device arranged to communicate to a control system of the vehicle; and a controller arranged to a) determine a state of charge of the battery;
    b) determine a battery temperature;
    c) determine a cranking temperature;
    d) obtaining a cranking signal from the battery when the battery is discharged during a crank of a combustion engine of the vehicle;
    e) determine one or more cranking type classes based on the determined battery temperature and the cranking temperature;
    f) determine battery parameters from the cranking signal corresponding to the one or more cranking type classes;
    g) determine the state of health of the battery for at least one or more cranking type classes, from the battery parameters determined corresponding to the cranking type class in a current state, a vehicle identifier and historical battery parameters corresponding to the one or more cranking type classes determined in a historic state preceding the current state; and
    h) output the state of health through the output device;

wherein determining the battery parameters from the cranking signal comprises obtaining an intermediate cranking signal based on the cranking signal and a window function;

filtering the intermediate signal and determining the battery parameters from the filtered cranking signal.

According to a third aspect, the invention provides a computer program product comprising computer program code means adapted to perform all the steps of any one of the method claims 1 to 13 when the computer program is run on a computer 1-13.

SHORT DESCRIPTION OF DRAWINGS

The present invention will be discussed in more detail below, with reference to the attached drawings, in which FIG. 1 shows an embodiment of an apparatus for determining a state of health of a battery;

DESCRIPTION OF EMBODIMENTS

Figure 1:
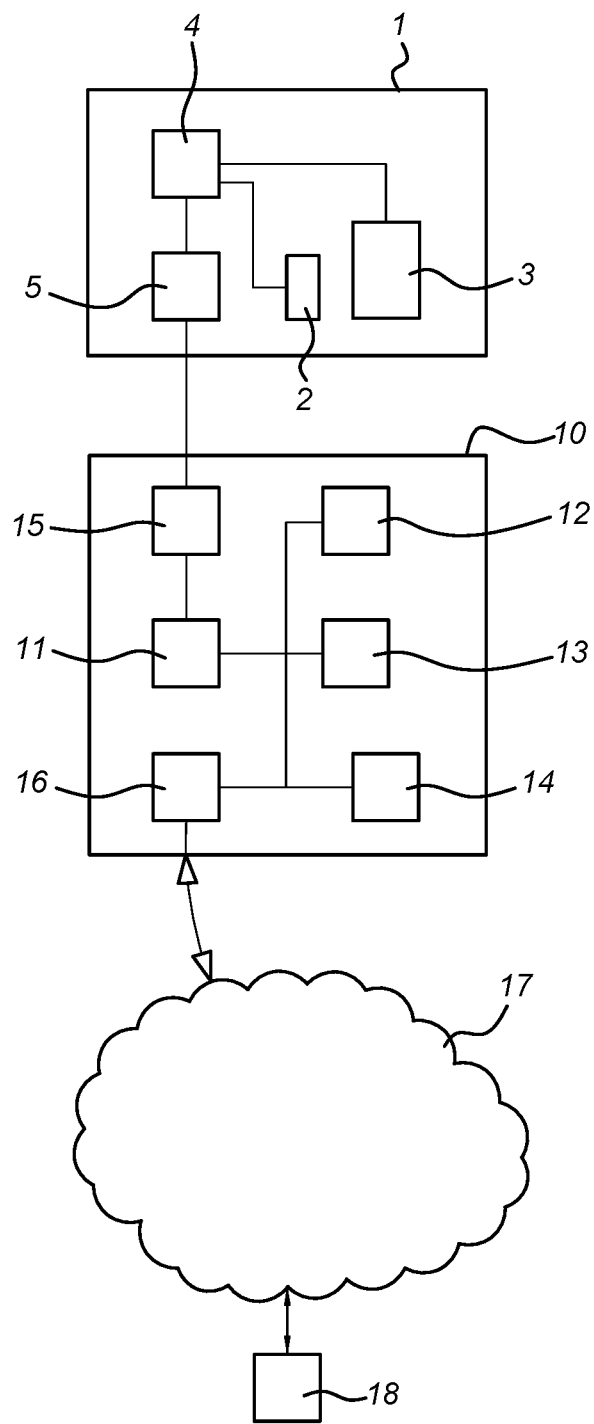

FIG. 1 is a block diagram of an internal structure of a device 10 or system comprising a user's computer in accordance with an exemplary embodiment of the present invention for determining a state of health of a battery 2 in a vehicle 1. The vehicle is provided with an engine 3 including a crank unit, a battery 2, an engine management system 4 and a vehicle communication device 5. The vehicle communication device 5 may comprise an on board diagnostic, device, OBD. The OBD can be connected via a Bluetooth or Wi-Fi device to the device 10.

The device 10 can be a personal computer, a smartphone, laptop or any other type of microprocessor based device. The device 10 may comprise a processor 11, an input device 12, a storage device 13, the storage device 13 can be a temporary storage device or permanent storage device and a first communication device 15 for connecting to the OBD 5. The first communication device 15 may include a modem, network interface card, or any other device able to transmit and receive signals to the vehicle communication device 5, for example Bluetooth or Wi-Fi. The input device 12 can be a key board, mouse, pen operated device and any other input device that provides input from a user. The device can further comprise a second communication device 16 and an output device 14. The second communication device 16 may include a modem, network interface card, or any other device able to communicate to the server 18 via the Internet 17. The output device 14 may be a monitor, speakers, printer or any other device that provides tangible output to a user. The temporary storage device may include RAM, caches, and any other volatile storage medium that temporarily holds data while processing it. The permanent storage device may include a solid state drive, hard drive, CD-ROM drive, tape drive, removable storage disk, or any other nonvolatile data storage medium. The temporality and permanent storage devices can store one or more of the determined parameters and values obtained during operation of the methods, described hereinafter.

Figure 2:
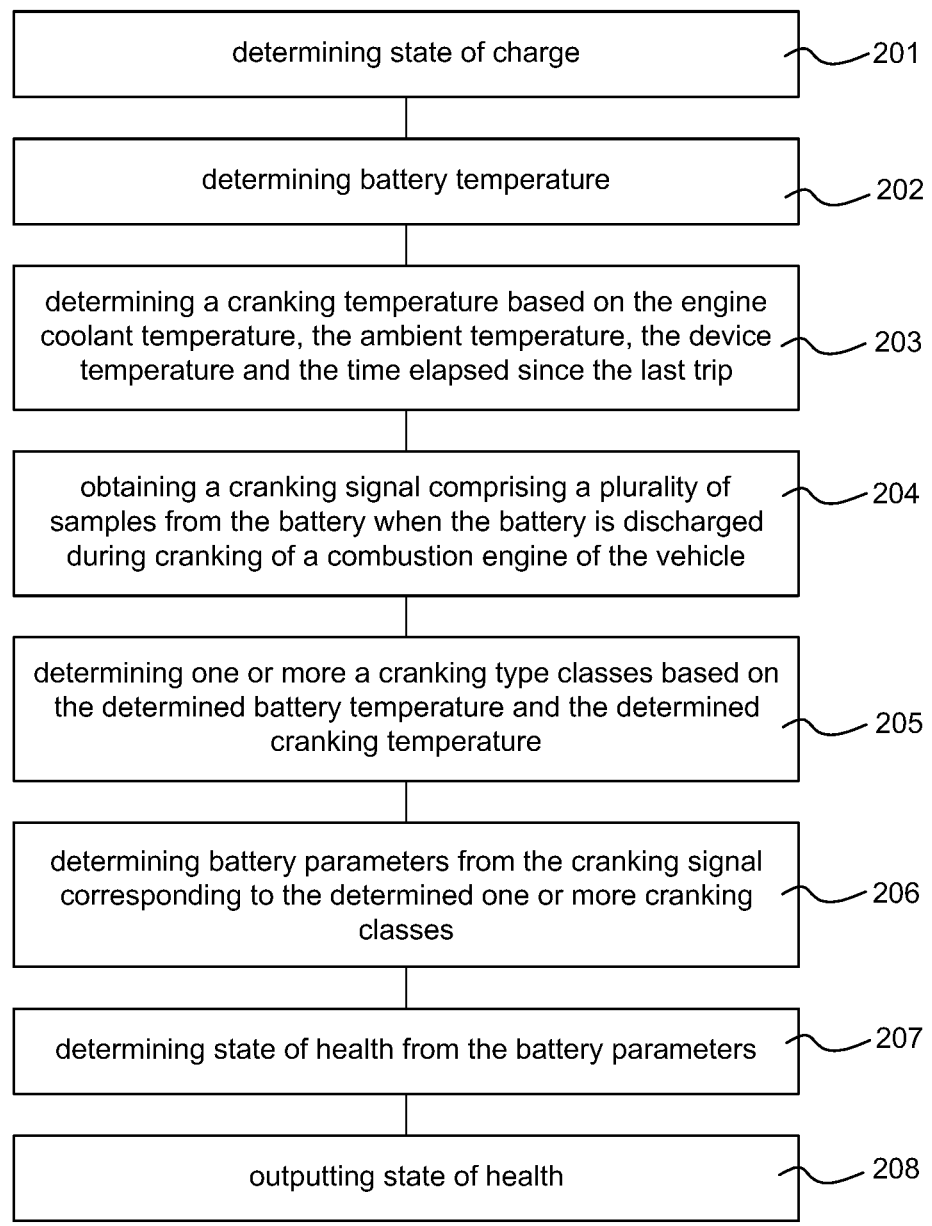
FIG. 2 shows a flow diagram of an embodiment of the method.

FIG. 2 shows a flow diagram according to an embodiment of the method for determining a state of health of the battery. In step 201 a state of charge of the battery is determined. According to an embodiment the state of charge can be determined by obtaining the open circuit voltage, OCV, of the battery after a predetermined rest period, wherein the vehicle is shut down and parked. The rest period can be for example 30 minutes. The thus obtained value proves to be a more accurate estimate of the OCV. The obtained value of the open circuit voltage is hereinafter called the rest value, RV. The RV is unique for a battery-vehicle combination. From the RV value a reference value can be obtained. A deviation from the reference value may indicate an insufficient state of charge of the battery.

Alternatively, according to an embodiment determining the state of charge of the battery may comprise the substeps of:

Measuring the values of the resting voltage of the battery at plurality of instants at a fixed time interval in an initial state and a current state.

Determining a derivative from the plurality of measured values in the initial state and the current state.

Determining a resting voltage derivative deviation based on the derivatives of the measured values in the initial state and the derivatives of the measured values in the current state;

wherein the determining the state of charge is based on the resting voltage derivative deviations.

According to an embodiment the method of determining the state of health can be discontinued and a message can be output on the display 14, when the determined state of charge of the battery is poor and a reliable state of health of the battery cannot be obtained.

In step 202 a battery temperature can be obtained. According to an embodiment the battery temperature is based on a combination of the engine coolant temperature, ambient temperature, device temperature a duration of last operation of a combustion engine, and time elapsed since last trip. These values can be obtained from the engine management unit via the communication interface and/or the OBD 5.

In step 203 a cranking temperature can be determined based on the engine coolant temperature, the ambient temperature, the device temperature and the time elapsed since the last trip. These values can also be obtained from the engine management unit via the communication interface and/or the OBD 5.

In step 204 a cranking signal can be obtained and can be a digital signal obtained during a cranking period by sampling the voltage of the battery, when the battery is discharged by the crank unit during one or more revolutions of the crank unit in the combustion engine during the cranking period. The cranking period is for example 1 sec. The sample frequency can be for example 200 Hz. So, according to this embodiment the cranking signal comprises 200 samples. The cranking signal can also be obtained from the communication device and/or the OBD.

In step 205 one or more cranking type classes of the battery are determined based on the determined battery temperature and the determined cranking temperature. The advantage of using cranking type classes is that the inventors recognized that the cranking type classes may define sets of reference battery parameters that are specific for each vehicle, the battery temperature and cranking temperature. A cranking temperature signal can also obtained from the communication device or the OBD. The cranking type classes can be selected on basis of the determined battery temperature and determined cranking temperature. The number of cranking type classes can be for example 17.

In step 206 the battery parameters, for example the lowest voltage value, LVV, and the mean cranking voltage, MCV are obtained from the cranking signals corresponding to one or more cranking type classes.

According to an embodiment the step of determining the battery parameters for the one or more cranking type classes in the initial state comprises determining battery parameters after each of a plurality of consecutive crank periods from the cranking signals; and determining the battery parameters based on an average of the measured battery parameters. These steps can be repeated for the all the cranking type classes.

According to an embodiment the step of determining battery parameters from the obtained cranking signal comprises the substeps of determining an intermediate cranking signal from the cranking signal and a filtered cranking signal from the intermediate cranking signal and determining the battery parameters from the filtered cranking signal.

Figure 3:
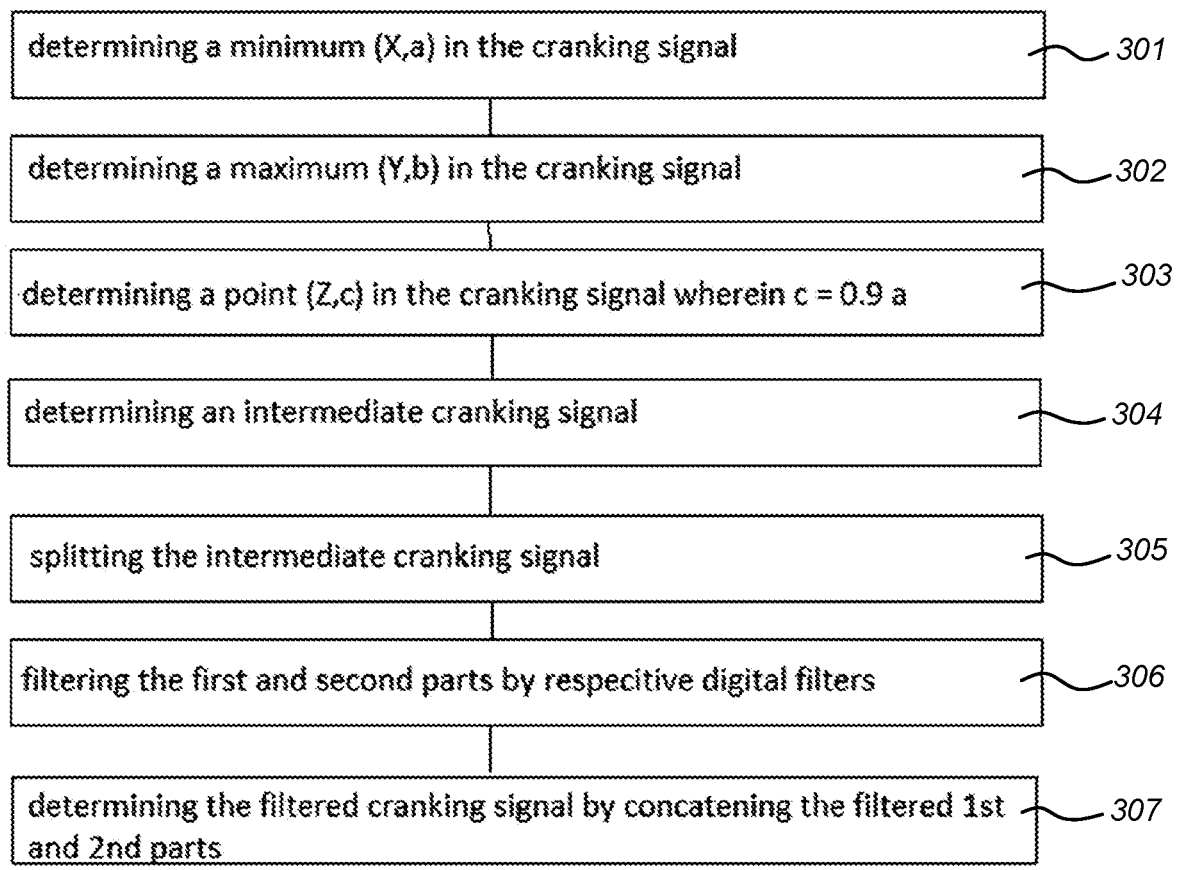
FIG. 3 shows a flow diagram of an embodiment of the method to determine a cranking signal.

FIG. 3 shows a flow diagram of an embodiment method to determine a filtered cranking signal from the cranking signal. In this description the cranking signal comprises N samples 1 . . . N.

The substeps for obtaining the filtered cranking signal from the cranking signal comprising:

Determining (301) a local minimum (X, a) in the cranking signal; wherein X represents a number of the sample in the cranking signal and a represents a value of the sample.

Determining (302) a local maximum (Y, b) in the cranking signal, wherein Y represents the sample number and satisfies 1<Y<X and b represents the value b of the sample;

Determining (303) a unique end point (Z, c), wherein Z represents a sample number between X and N in the cranking signal that corresponds to the number of the sample which value c equals a predetermined coefficient α multiplied by the value b of the determined local maximum. In an embodiment the coefficient α is 0.9. and the value c is 0.9 b. This unique end point (Z, c) of the cranking signal is applied in a window function to obtain an intermediate cranking signal. An advantage if this unique end point (Z, c) is that it is independent of the user of the car or engine.

Determining (304) an intermediate cranking signal of the samples Y to the endpoint Z of the cranking signal. The resulting intermediate cranking signal is the result of the window function applied on the cranking signal, wherein the window function transfers the samples Y to Z.

The intermediated cranking signal is then filtered by:

Splitting (305) the Z–Y samples of the intermediate cranking signal in a first part of samples Y to X and a second part of samples X to Z.

Filtering (306) the first part by a first digital filter and the second part by a second digital filter. In an embodiment the digital filters can be a Saviki-Golay filter, as is well-known for the skilled person, in the respective Saviki-Golay filter the frame length and polynomial order can be differently selected depending on the variation of the values in the first and second part of the intermediate cranking signal.

Determining (307) the filtered cranking signal by concatenating the filtered second part after the filtered first part.

Figure 9:
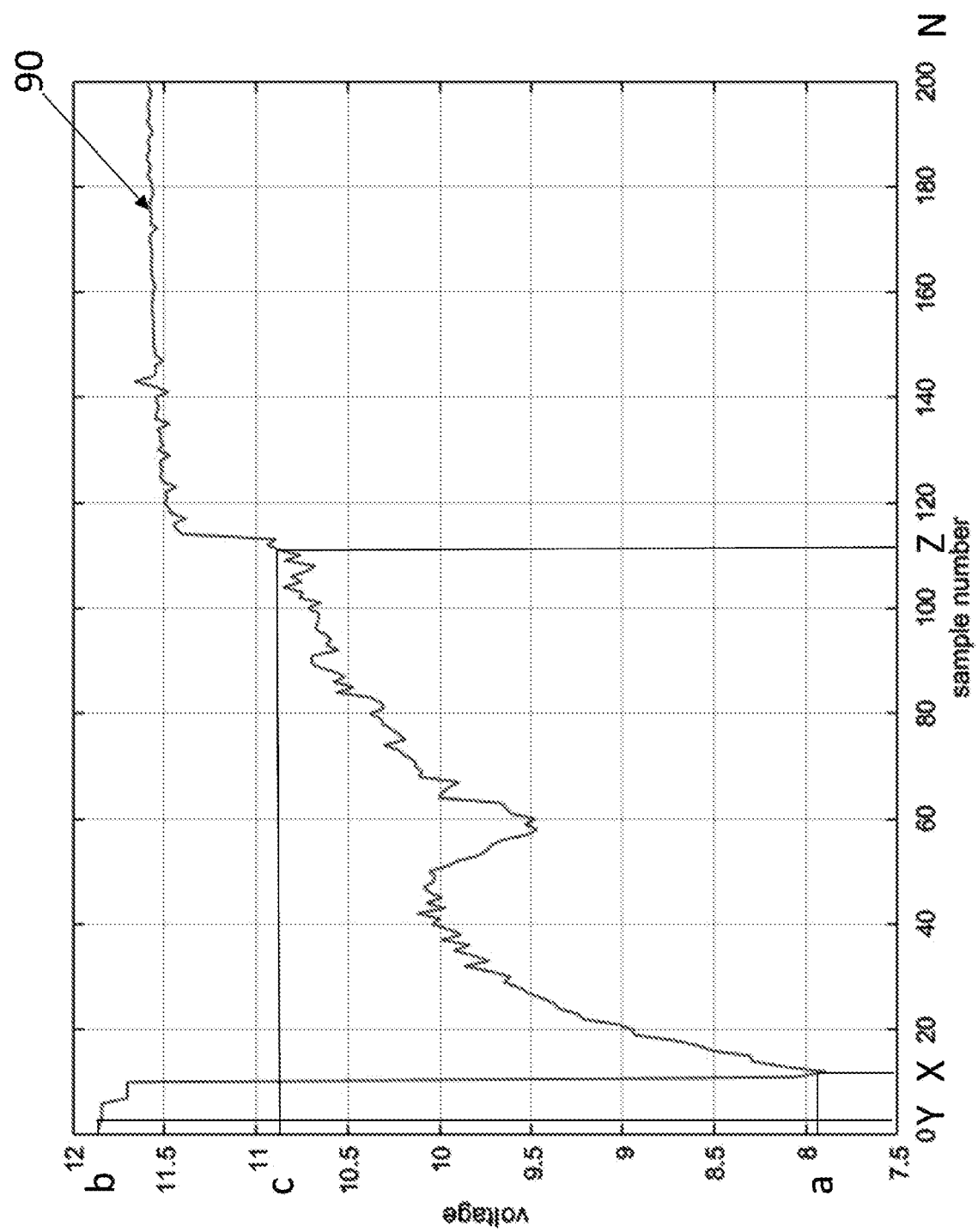
FIG. 9 shows a graphical representation of a cranking signal.

FIG. 9 shows a graphical representation of the cranking signal. In the graph (X,a) represents a local minimum of the cranking signal 90, (Y,b) represents a local maximum of the cranking signal, and (Z,c) represents a value c of sample Z, which sample number is determined between X and N in the cranking signal such that the value c equals 0.9 b.

Figure 4:
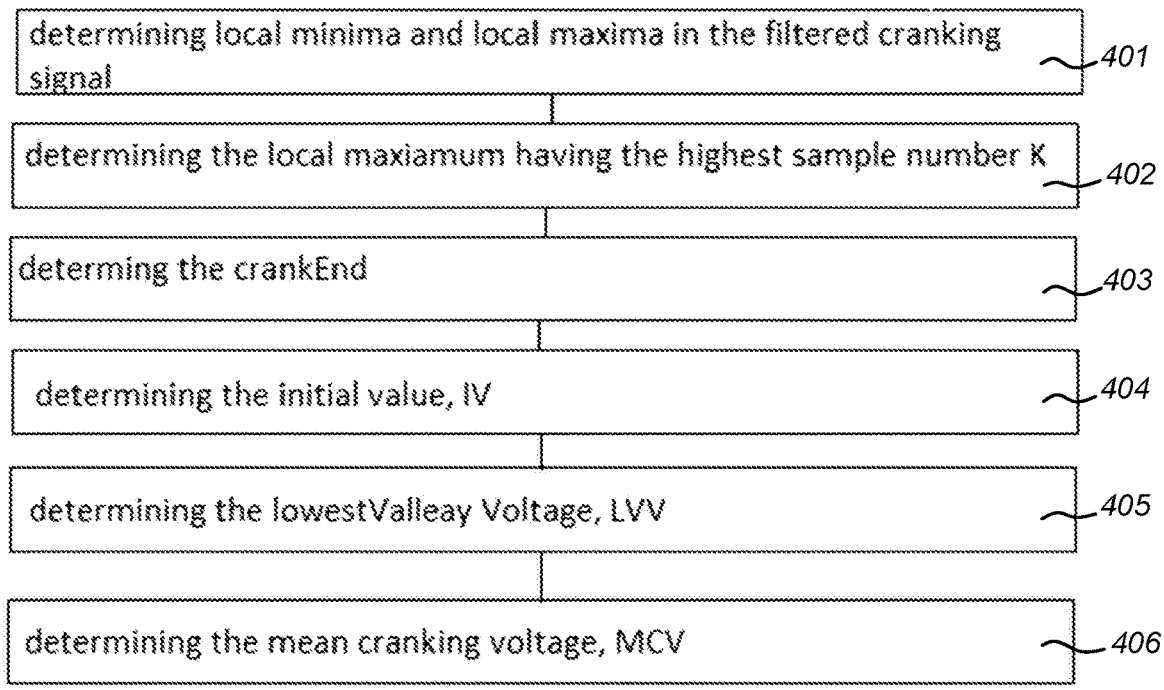
FIG. 4 shows a flow diagram of an embodiment of the method to determine battery parameters from the filtered cranking signal.

FIG. 4 shows a flow diagram of an embodiment of the method to determine battery parameters from the filtered cranking signal. The substeps to determine the battery parameters comprises: Firstly determining a parameter crankEnd by the substeps:

Determining (401) local minima and local maxima in the filtered cranking signal.

Determining (402) the local maximum (K, $Max_{local}$) having the highest sample number K from the local maxima.

Determining (403) the crankEnd as the sample number S corresponding to a sample (S, d) in the filtered cranking signal wherein S is between K and Z and d equals $Max_{local}$.

determining at least one or more of the determined local maxima (i,$max_i$) for which the sample number i is smaller than X. This number can be for example 3.

determining (404) the initial value, IV, from the average of the one or more determined local maxima $max_i$ values.

Determining (405) the lowestValleyVoltage, LVV as the lowest local minimum (L, Minlocal) from the filtered cranking signal.

And determining (406) the mean cranking voltage, MCV, by averaging the values $s_m$ of the samples L to S, so the values of the sample of the filtered signal between the sample number between the lowestVallyeVoltage and the sample number S corresponding the crankEnd or $$MCV = \frac{1}{M} \sum_{m=L}^{M=Z} (s_m, m)$$

Wherein M represents the number of samples determined by S-L.

In this way the filtered cranking signal with a user independent crank end can be determined.

According to an embodiment the state of health of the battery can be based on a comparison of the battery parameters IV, LVV, MCV in a historic or initial state and the determined parameters IV, LVV and MCV in the current state for the different cranking type classes from the filtered cranking signal. The determined values of these battery parameters can be stored in a table or database in a local memory 13 of the device 10 or in the data base server 18 which can be accessed by the device 10 through the Internet 17.

An example of battery parameters IV, LVV and MCV are listed in table 1 for 17 cranking type classes.

TABLE 1 table of cranking type classes and batteryparameters

| crankingTypeClass | completed | IV | MCV | LVV |
|---|---|---|---|---|
| H1 | FALSE | | | |
| H2 | FALSE | | | |
| H3 | FALSE | | | |
| H4 | FALSE | 12.17 | 9.79 | 8.03 |
| H5 | FALSE | | | |
| W1 | FALSE | | | |
| W2 | FALSE | | | |
| W3 | FALSE | 12.17 | 9.92 | 8.07 |
| W4 | TRUE | 12.18 | 9.88 | 8.13 |
| W5 | FALSE | | | |
| C1 | FALSE | | | |
| C2 | FALSE | 11.93 | 9.68 | 7.51 |
| C3 | TRUE | 11.97 | 9.46 | 7.81 |
| C4 | TRUE | 12.04 | 9.74 | 7.92 |
| C5 | FALSE | | | |
| N1 | FALSE | 12.13 | 8.05 | 9.81 |
| etc. | | | | |

The values for IV, MCV and LVV in Table 1 can be stored and updated in the data base after the cranking events in the corresponding cranking type class.

Figure 5:
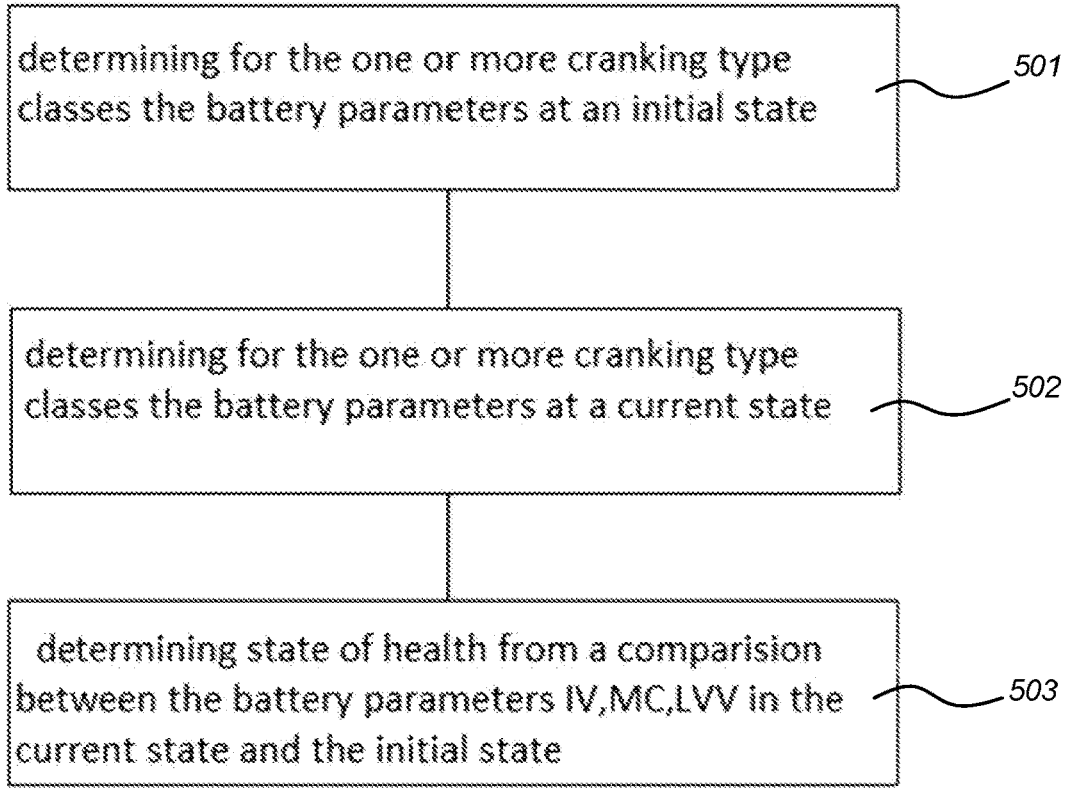
FIG. 5 shows a flow diagram of a first embodiment of the method to determine a state of health from the battery parameters.

FIG. 5 shows a flow diagram of a first embodiment of the method to determine a state of health from the battery parameters. According to this embodiment the step of determining the state of health of the battery comprises the substeps:

Determining (501) for the at least one or more cranking type classes the battery parameters at an initial state of the battery for the at least one or more cranking type classes according to steps 200-204.

Determining (502) for the at least one or more cranking type classes the battery parameters at a current state of the battery for the at least one or more cranking type classes according to steps 200-204.

Determining (503) the state of health of the battery from a comparison of the determined battery parameters IV, MCV, LVV in the initial state and the parameters IV, MCV, LVV in the current state by applying a normalized field method on the normalized battery parameters in the determined cranking type class, wherein the normalized battery parameters are based on the battery parameters MCV, LVV in the current state and the battery parameters MCV, LVV in the initial state.

$$\text{normalized battery parameter} = \frac{\text{battery parameter determined in current state}}{\text{battery parameter in the initial state}}$$

Determining (504) the state of health of the battery according to the inequality $$\text{normalized LVV} \times \text{normilized MCV} < C_1 \qquad (2).$$

Wherein $C_1$ is a constant that can be experimentally determined and its value can be for example 0.8.

The state of health of the battery is set to poor when the inequality is true. In this application an indication of the state of health as poor indicates a high change of battery failure. When the inequality is false the state of health of the battery is set to healthy. In this application an indication of the state of health as healthy indicates a new or freshly installed battery. The battery parameters of the initial state can be obtained from the local memory 13 or the database server 18.

Figure 6:
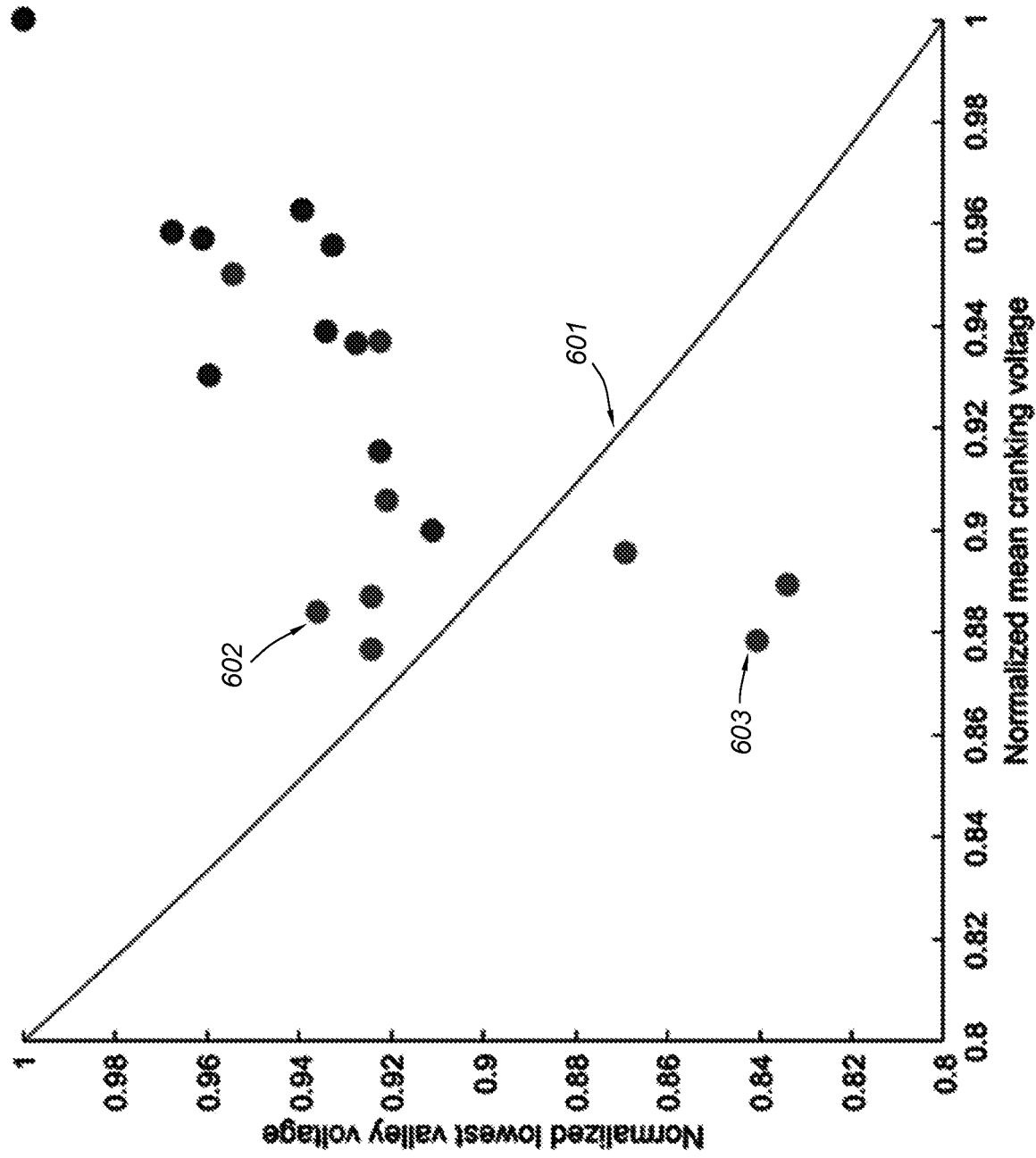
FIG. 6 shows a graphical representation of a two-dimensional normalized parameter field.

In a next step (208) of the method the device can output the determined state of health FIG. 6 shows a graphical representation of a 2D-parameter field of the normalized LVV and the normalized MCV. FIG. 6 shows a separation line 601 indicating the separation between a healthy state and a poor state of the battery. The area including a point 602 above and right of the separation line indicates the healthy state. The area including a point 603 below and left of the separation line indicates the poor state.

Figure 7:
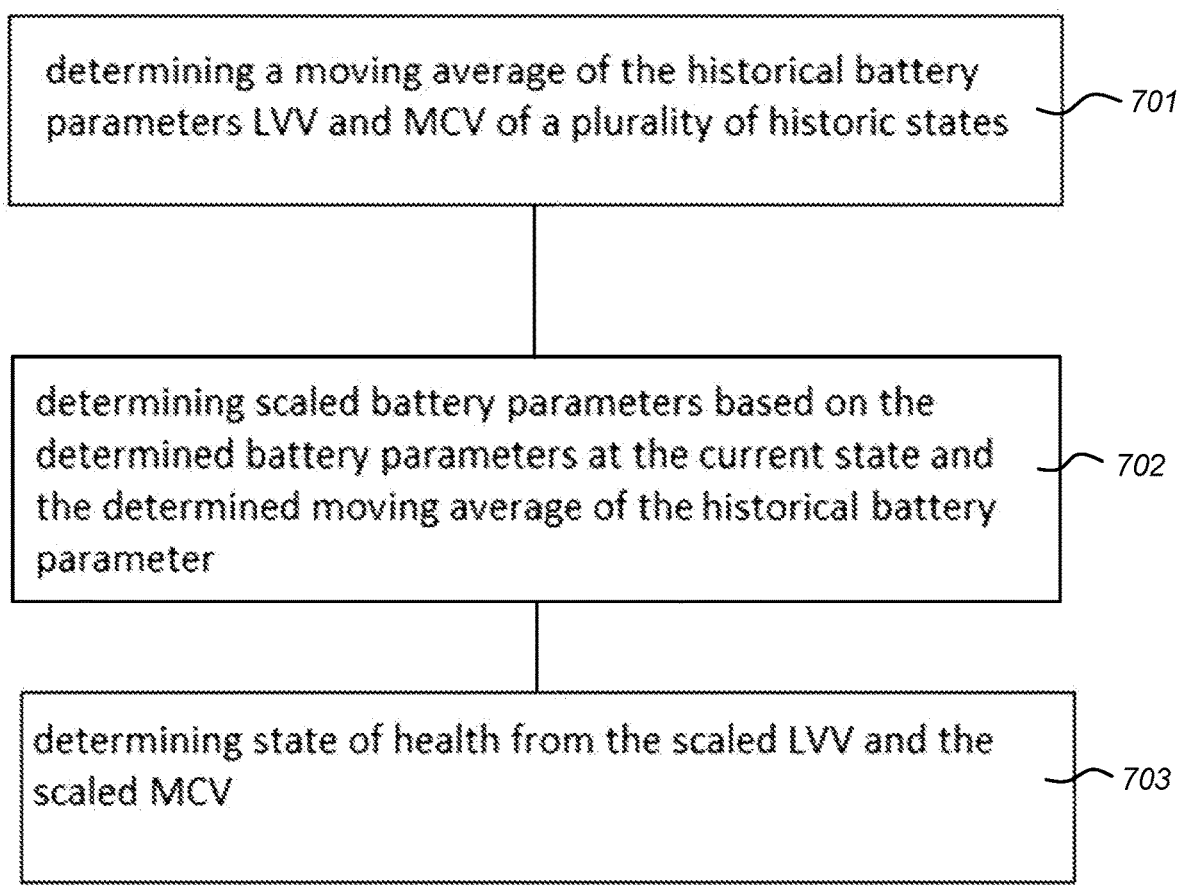
FIG. 7 shows a flow diagram of a second embodiment of the method for determining a state of health from the battery parameters.

FIG. 7 shows a flow diagram of a second embodiment of the method for determining a state of health from the battery parameters. According to this embodiment the step of determining the state of health of the battery in a cranking type class comprises the substeps:

Determining (701) a moving window average of the historical battery parameter LVV and MCV for a current state based on historical battery parameter LVV and MCV corresponding to historic states or previous cranks stored in the local memory 13, or that can be retrieved via the Internet 17 from the data base server 18. In an embodiment, the moving window average can be based on 30 stored historic states by a moving window of a width spanning 20 states, in the cranking type class from a first historic state N=−30 to a second historic state N=−10 before the current state in a the cranking type class according to formula $$\text{average battery parameter} = \frac{1}{W} \sum_{t=T-30}^{t=T-30+W} \text{battery parameter}(t)$$

Wherein t represents a sample number t, T represents a current state and W represents the width of the window.

Determining (702) a scaled battery parameter based on the battery parameter determined at the current state and the determined moving window average of the historical battery parameter in the cranking type class.

$$\text{scaled battery parameter} = \frac{\text{battery parameter determined in current state}}{\text{average battery parameter}}$$

Determining (703) the state of health of the battery from the scaled LVV and the scaled MCV according to the inequalities $$\text{scaled LVV} < C_2 \cdot \text{AND} \cdot \text{scaled MCV} < C_3$$

Wherein $C_2$ and $C_3$ respectively represents a constant that can be experimentally determined and can be for example 0.75 for both constants $C_2$ and $C_3$.

The state of health of the battery is poor when both inequalities are true.

Figure 8:
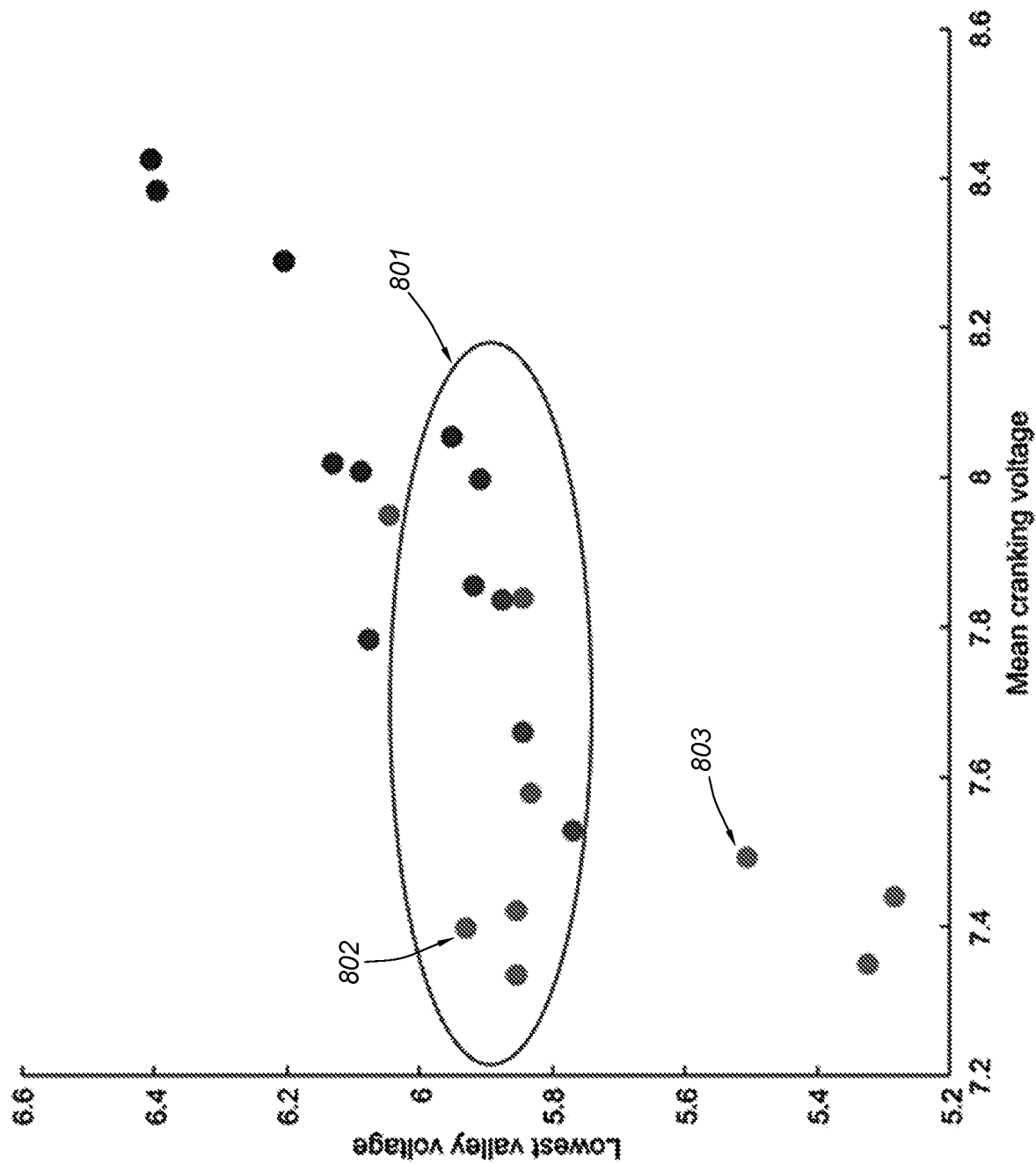
FIG. 8 shows a graphical representation of a two-dimensional non-scaled parameter field.

FIG. 8 shows a graphical representation of a 2D-parameter field for the unscaled MCV and the unscaled LVV. FIG. 8 shows an ellipsoid 801 indicating an area of a healthy state of the battery. Combined values of the MCV and the LVV in the lower left corner of the field, for example a point 803 correspond to a poor state of health of the battery. A point 802 in FIG. 8 corresponds to a still healthy state.

In step (208) the device can output the determined state of health of the battery as poor indicating a high change of battery failure.

The present invention can be described as a method and apparatus for determining a state of health of a battery in a vehicle comprising determining (201) a state of charge of the battery; determining (202) a battery temperature, determining a cranking temperature based on the engine coolant temperature, the ambient temperature, the device temperature and the time elapsed since the last trip; obtaining (204) a cranking signal from the battery when the battery is discharged during cranking of a combustion engine of the vehicle; determining (205) one or more cranking type classes based on the determined battery temperature and the determined cranking temperature; determining (206) battery parameters from the cranking signal; determining (207) the state of health of the battery from the battery parameters, a vehicle identifier and historical battery parameters determined in a historic state preceding the current state; and outputting (206) the state of health, wherein determining the battery parameters from the cranking signal comprises applying a window function on the cranking signal to obtain an intermediate cranking signal, filtering the intermediate cranking signal and determining the battery parameters from the filtered cranking signal In this way a reliable indication can be obtained from the state of health of the battery in the vehicle.

The present invention has been described above with reference to a number of exemplary embodiments as shown in the drawings. Modifications and alternative implementations of some parts or elements are possible, and are included in the scope of protection as defined in the appended claims.

In the foregoing description of the figures, the invention has been described with reference to specific embodiments thereof. It will, however, be evident that various modifications and changes may be made thereto without departing from the scope of the invention as summarized in the attached claims.

In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the appended claims.

In particular, combinations of specific features of various aspects of the invention may be made. An aspect of the invention may be further advantageously enhanced by adding a feature that was described in relation to another aspect of the invention.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

Some or all aspects of the invention may be suitable for being implemented in form of software, in particular a computer program product. The computer program product may comprise a computer program stored on a non-transitory computer-readable media. Also, the computer program may be represented by a signal, such as an optic signal or an electro-magnetic signal, carried by a transmission medium such as an optic fiber cable or the air. The computer program may partly or entirely have the form of source code, object code, or pseudo code, suitable for being executed by a computer system. For example, the code may be executable by one or more processors.

The invention claimed is:

1. A method for determining a state of health of a battery in a vehicle comprising the steps of
   a) determining (201) a state of charge of the battery;
   b) determining (202) a battery temperature;
   c) determining (203) a cranking temperature based on the engine coolant temperature, the ambient temperature, the device temperature and the time elapsed since the last trip;
   d) obtaining (204) a cranking signal comprising a plurality of samples from the battery when the battery is discharged during cranking of a combustion engine of the vehicle;
   e) determining (205) one or more cranking type classes based on the determined battery temperature and the determined cranking temperature;
   f) determining (206) battery parameters from the cranking signal corresponding to the determined one or more cranking type classes;
   g) determining (207) the state of health of the battery for the at least one or more cranking type classes from the battery parameters determined corresponding to the cranking type class in a current state, a vehicle identifier and historical battery parameters corresponding to the one or more cranking type classes determined in a historic state preceding the current state; and
   h) outputting (208) the state of health;
   wherein determining the battery parameters from the cranking signal comprises
   obtaining an intermediate cranking signal based on the cranking signal and a window function;
   filtering the intermediate cranking signal and determining the battery parameters from the filtered cranking signal.

2. The method according to claim 1, wherein the historic state corresponds to an initial state of the battery.

3. The method according to claim 2, wherein determining the state of health comprises performing a normalized field method on the battery parameters in the initial state and the current state in the cranking type class, wherein an area of a poor state of the battery is based on two normalized battery parameters.

4. The method according to claim 2, wherein determining the battery parameters for the one or more cranking type classes in the initial state comprises:
   a) determining the battery parameters after each of a plurality of consecutive crank periods;
   b) determining the initial battery parameters based on an average of the measured battery parameters; and
   c) repeating steps 3a and 3b for each of the one or more cranking type classes.

5. The method according to claim 4, wherein the battery parameters comprises an initial voltage, IV, a lowest voltage value, LVV, and a mean cranking voltage, MCV.

6. The method according to claim 1, wherein determining the state of health comprises
   determining a moving window average of the historical battery parameter of a plurality of historic states in the cranking type class;
   determining a scaled battery parameter based on the battery parameter determined at an current state and the determined moving window average of the historical battery parameter in the cranking type class; and
   determining the state of health at the current state from the scaled battery parameters.

7. The method according to claim 6, wherein the moving window average of the historic battery parameter is determined from a first historic state N-30 to a second historic state N-10 before the current state N in the cranking type class.

8. The method according to claim 6, wherein the battery parameters comprises a lowest voltage value, LVV and a mean cranking voltage, MCV.

9. The method of claim 1 wherein determining the state of charge of the battery comprises
   determining, after a resting period of the combustion engine, a resting voltage of the battery;
   determining a reference value for the resting voltage;
   measuring the resting voltage of the battery in a current state after an operating period of the combustion engine;
   determining the state of charge of the battery based on the reference resting voltage value, the measured resting value and the operating period;
   deciding to continue or discontinue the determination of the state of health of the battery depending of the state of charge of the battery.

10. The method of claim 1, wherein determining the battery temperature is based on an engine coolant temperature, ambient temperature, device temperature; duration of last operation of the combustion engine and time elapsed since the last operation.

11. The method of claim 1, wherein obtaining the intermediate cranking signal comprises:
    determining a minimum of the cranking signal;
    determining a maximum of the cranking signal between the first sample of the cranking signal and the determined minimum of the cranking signal;
    determining an endpoint of the cranking signal that corresponds to a sample number corresponding to a value that is equal to a predetermined coefficient multiplied by the determined maximum and the sample number is larger than the sample number corresponding to the determined minimum;
    wherein the window function is arranged to pass the samples between the determined maximum and the determined end point of the cranking signal and obtaining the intermediate cranking signal.

12. The method of claim 1, wherein the filtering of the intermediate cranking signal comprises
splitting the intermediate cranking signal in a first part comprising samples in the range between a maximum and a minimum and a second part comprising samples in the range between the minimum and an endpoint of the intermediate cranking signal;
filtering the first and second parts by a first and second digital filter respectively; and
obtaining the filtered cranking signal by concatenating the filtered first and second parts.

13. The method of claim 12, wherein the first and second digital filter comprises a Saviki-Golay filter respectively, wherein a frame length and a polynomial order of the respective filters are different based on the characteristics of respective first and second parts.

14. A device for determining a state of health of a battery (2) in a vehicle (1) comprising
a storage device (13),
an input device (12);
an output device (14) comprising a display;
a communication device (15) arranged to communicate to a control system of the vehicle; and
a controller (11) arranged to
a) determine a state of charge of the battery;
b) determine a battery temperature;
c) determine a cranking temperature;
d) obtaining a cranking signal from the battery when the battery is discharged during cranking of a combustion engine of the vehicle;
e) determine one or more cranking type classes based on the determined battery temperature and the determined cranking temperature;
f) determine battery parameters from the cranking signal corresponding to the determined one or more cranking type classes;
g) determine the state of health of the battery for at least one or more cranking type classes, from the battery parameters determined corresponding to the cranking type class in a current state, a vehicle identifier and historical battery parameters corresponding to the one or more cranking type classes determined in a historic state preceding the current state; and
h) output the state of health through the output device;
wherein determining the battery parameters from the cranking signal comprises
obtaining an intermediate cranking signal based on the cranking signal and a window function;
filtering the intermediate cranking signal and determining the battery parameters from the filtered cranking signal.

15. A computer program product comprising computer program code means adapted to perform all the steps of the method of claim 1, when the computer program is run on a computer.

16. A computer-readable storage medium cause the computer to carry out the steps of the method of claim 1.

* * * * *